United States Patent
Hsieh et al.

(10) Patent No.: US 11,011,444 B2
(45) Date of Patent: May 18, 2021

(54) SEMICONDUCTOR PACKAGE STRUCTURE

(71) Applicant: Advanced Semiconductor Engineering, Inc., Kaohsiung (TW)

(72) Inventors: Ya-Yu Hsieh, Kaohsiung (TW); Chin-Li Kao, Kaohsiung (TW); Chung-Hsuan Tsai, Kaohsiung (TW); Chia-Pin Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/540,837

(22) Filed: Aug. 14, 2019

(65) Prior Publication Data

US 2021/0050273 A1  Feb. 18, 2021

(51) Int. Cl.
| | |
|---|---|
| *H01L 23/29* | (2006.01) |
| *H01L 23/00* | (2006.01) |
| *H01L 23/31* | (2006.01) |
| *H01L 21/66* | (2006.01) |

(52) U.S. Cl.
CPC .......... *H01L 23/295* (2013.01); *H01L 22/32* (2013.01); *H01L 23/298* (2013.01); *H01L 23/3107* (2013.01); *H01L 24/08* (2013.01); *H01L 24/16* (2013.01); *H01L 2224/02371* (2013.01); *H01L 2924/351* (2013.01)

(58) Field of Classification Search
CPC ......... H01L 24/16; H01L 24/08; H01L 22/32; H01L 23/3107
See application file for complete search history.

(56) References Cited

U.S. PATENT DOCUMENTS

| | | | |
|---|---|---|---|
| 6,288,439 B1 * | 9/2001 | Bandou | H01L 23/49572 257/666 |
| 2009/0325348 A1 * | 12/2009 | Gerber | H01L 21/563 438/120 |
| 2017/0005035 A1 * | 1/2017 | Chen | H01L 24/05 |
| 2019/0103375 A1 * | 4/2019 | Huang | H01L 24/97 |

* cited by examiner

*Primary Examiner* — Matthew L Reames
(74) *Attorney, Agent, or Firm* — Foley & Lardner LLP

(57) ABSTRACT

The present disclosure provides a semiconductor package structure having a semiconductor die having an active surface, a conductive bump on the active surface, configured to electrically couple the semiconductor die to an external circuit, the conductive bump having a bump height, a dielectric encapsulating the semiconductor die and the conductive bump, and a plurality of fillers in the dielectric, each of the fillers comprising a diameter, wherein a maximum diameter of the fillers is smaller than the bump height.

17 Claims, 20 Drawing Sheets

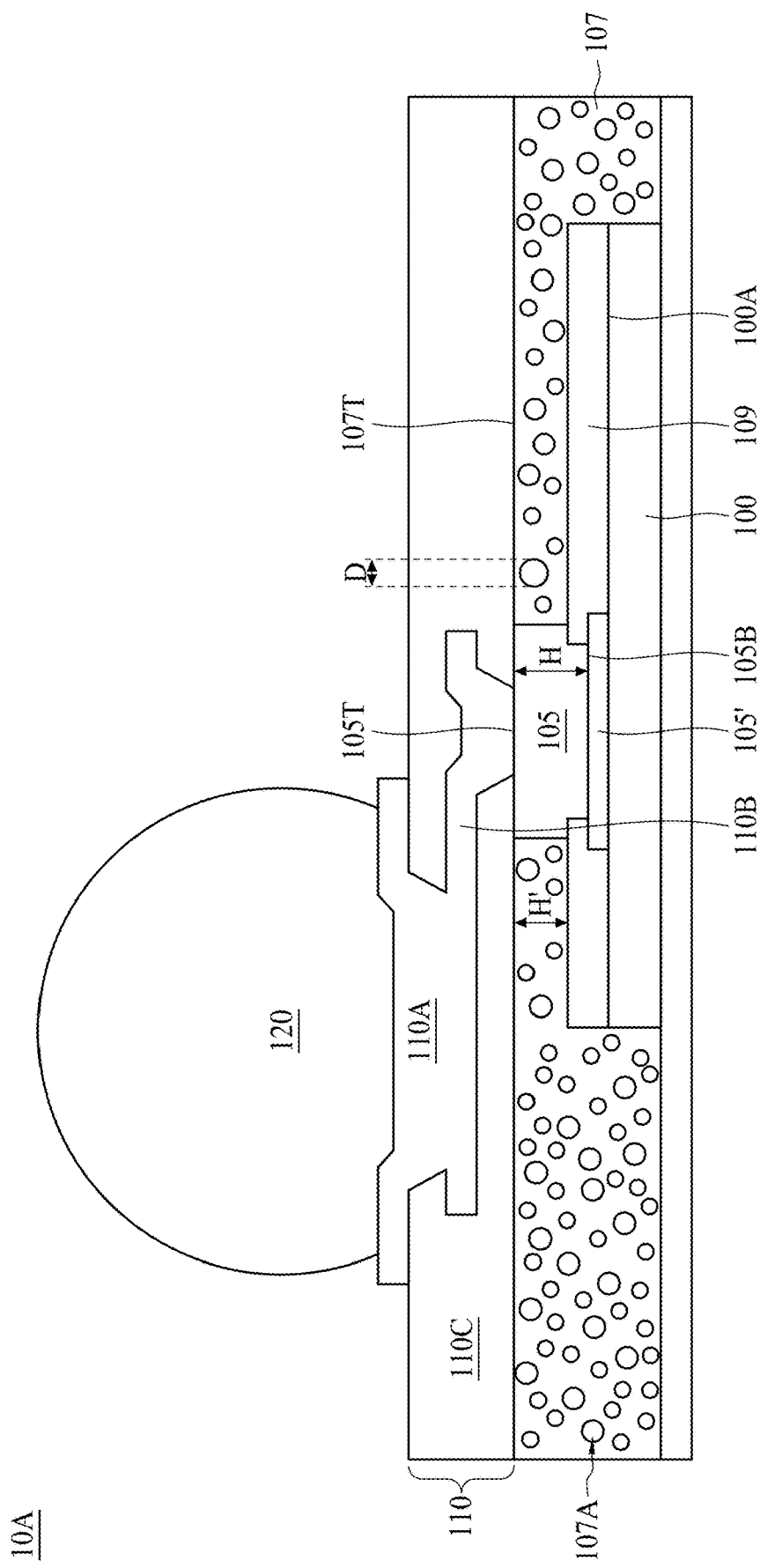

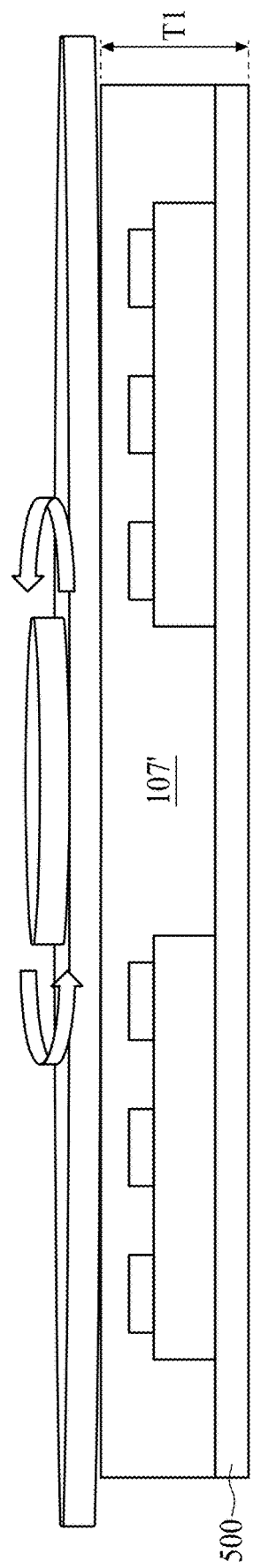

SEMICONDUCTOR PACKAGE STRUCTURE

BACKGROUND

1. Technical Field

The present disclosure relates to a semiconductor package structure having an encapsulant allowing the semiconductor package structure to better endure a thermal cycle reliability test.

2. Description of the Related Art

Packaged semiconductor chips are subject to various reliability tests including a thermal cycling reliability test. Testing conditions are designed to ensure the packaged semiconductor chips which passing the test possess certain reliability for their corresponding applications.

Thermal testing and/or cycling of a batch of packaged semiconductor chips ordinarily is accomplished by placing a large number of packaged semiconductor chips in a plastic carrier, placing the carrier in a thermal chamber, and either heating the chamber and/or passing a heated gas or liquid medium through the chamber. For temperature cycling, typically the carrier and the packaged semiconductor chips therein are alternately subjected to "hot baths" and "cold baths" of gas or liquid medium to provide rapid thermal ramp-up times and thermal ramp-down times.

SUMMARY

In some embodiments, the present disclosure provides a semiconductor package structure having a semiconductor die having an active surface, a conductive bump on the active surface, configured to electrically couple the semiconductor die to an external circuit, the conductive bump having a bump height, a dielectric encapsulating the semiconductor die and the conductive bump, and a plurality of fillers in the dielectric, each of the fillers comprising a diameter, wherein a maximum diameter of the fillers is smaller than the bump height.

In some embodiments, the present disclosure provides a semiconductor package structure, the semiconductor package structure including a semiconductor die having an active surface; a conductive pad on the active surface; a passivation partially covering the pad and over the active surface; a conductive bump on the conductive pad, configured to electrically couple the semiconductor die to an external circuit; an encapsulant encapsulating the semiconductor die and the conductive bump. The semiconductor package structure has a passing rate greater than 95% to JESD22-A104G test.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1A illustrates a cross-sectional view of a semiconductor package structure according to some embodiments of the present disclosure.

FIG. 6A to FIG. 6B illustrate cross sectional view of a semiconductor package structure in a grinding operation for manufacturing the semiconductor package structure, according to some embodiments of the present disclosure.

DETAILED DESCRIPTION

Figure 1B:
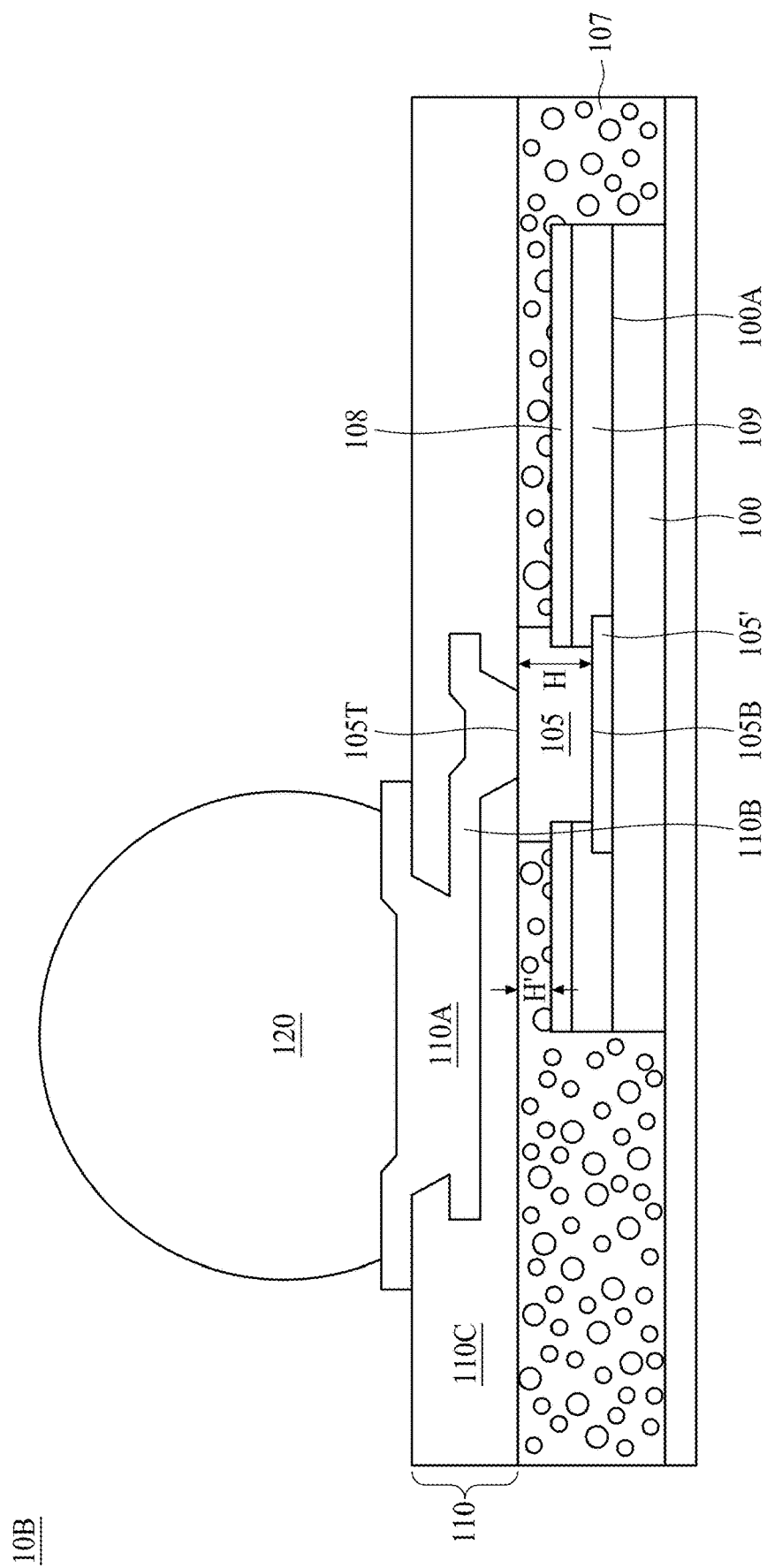
FIG. 1B illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Two major components of molding compound are silica fillers (about 70-80 vol %) and epoxy resin (about 12-15 vol %). The main purpose of silica filler is to increase mechanical strength of the molding compound and to reduce linear coefficient of thermal expansion.

M-series is a package structure with a reconstitution structure including a semiconductor die, a conductive bump on an active surface of the semiconductor die, a passivation partially cover a conductive pad receiving the conductive bump, and a redistribution layer (RDL) over the reconstitution structure.

In a reliability test including temperature cycle test (−40~125 degrees Celsius), M-series product is observed to have delamination problem at the interface between passivation and molding compound. Due to the stiff character of the silica filler, high stress impact is applied to bottom materials (e.g., passivation) during a grinding operation. Under the condition where 55-micron-cut silica fillers are used, when molding compound is thinned down by grinding to a certain thickness (e.g., 25 micron), the delamination can be observed. According to simulation results, highest stress 228 MPa at −40 degrees Celsius and 138 MPa at 125 degrees Celsius occur at silica fillers having greatest size close to 55 micron. Smaller filler size (e.g., diameter) is associated with higher manufacturing cost and thus manufacturers may be discouraged from applying small size filler.

Present disclosure provides an M-series package structure having a filler size (e.g., diameter) smaller than a reference height of the conductive bump. Smaller filler size reduces stress at the interface of the passivation and molding compound, thereby alleviating molding delamination problem. In addition, adding a buffer layer (e.g., PI, PBO) between the passivation and molding compound, or reducing the volumetric content of filler in the molding compound may also help with reducing the stress concentration that lead to delamination.

Referring to FIG. 1A, FIG. 1A illustrates a cross-sectional view of a semiconductor package structure 10A according to some embodiments of the present disclosure. The semiconductor package structure 10A includes a semiconductor die 100, a dielectric 107, and a redistribution layer (RDL) 110 over the semiconductor die 100 and the dielectric 107. The semiconductor die 100 has an active surface 100A and a back surface opposite to the active surface 100A. A conductive pad 105' is on the active surface 100A of the semiconductor die 100, and a conductive bump 105 is positioned on the conductive pad 105'. The conductive pad 105' may be partially covered by a passivation 109, which is also disposed on the active surface 100A. In some embodiments, the conductive pad 105' may be adjacent to, under, or exposed from the active surface 100A.

The conductive bump 105 has a top surface 105T and a bottom surface 105B. The top surface 105T may be in contact with an external circuit 110B of the RDL 110. The bottom surface 105B may be in contact with the conductive pad 105'. A bump height H is measured from the top surface 105T to the bottom surface 105B. As shown in FIG. 1A, a portion of the conductive bump 105 stands off from the passivation 109 while another portion of which is laterally surrounded by the passivation 109. A stand-off height H' of the conductive bump 105 is measured from a top surface of the passivation 109 to the top surface 105T of the conductive bump 105. In other words, the stand-off height H' of the conductive bump 105 may be the distance between a bottom surface of the RDL 110 and a top surface of the passivation 109, regardless the location of the passivation 109. Alternatively stated, the stand-off height H' of the conductive bump 105 is determined by a grinding operation that thin down the conductive bump 105 from the top surface 105T and the thickness of the passivation 109, and in some embodiment, the stand-off height H' of the conductive bump 105 substantially equals to the thickness of the portion of the dielectric 107 over the active surface 100A of the semiconductor die 100 after the grinding operation. In some embodiments, the conductive bump 105 may be composed of CMOS-compatible materials such as copper. In some embodiments, the conductive bump 105 includes a copper stud, a copper pillar, or a copper pin.

In some embodiments, the passivation 109 is composed of material with higher stiffness than the underlying semiconductor die 100. For example, the passivation 109 may be composed of inorganic materials. The passivation 109 may include semiconductor nitrides, for example, silicon nitrides.

The dielectric 107, or in some embodiments the encapsulant or the molding compound, encapsulates the semiconductor die 100 at least from its active surface 100A and its side surface. A plurality of fillers 107A can be observed in the dielectric 107. As previously described, function of the fillers 107A is to increase mechanical strength of the dielectric 107 and to reduce linear coefficient of thermal expansion of the dielectric 107. The resin is the base material of the dielectric 107. The resin may be either a thermoplastic or thermoset type. Filler material is added to this resin material to enhance structural integrity in IC packaging applications. Fused or crystalline $SiO_2$ (silica) or glass fibers often serve as the filler material. As well as improving the mechanical strength of the molding compound, such filler material also reduces the thermal coefficients of expansion, and, therefore, reduces the dielectric 107 shrinkage after molding. Small amounts of coupling agents, coloring agents, flame retardants, plasticizers, and wax may also be added to optimize the dielectric 107 as specified. Additionally, hardeners and catalysts may be combined with the thermoset resin. Note the dielectric 107 possesses a surface 107T parallel and proximal to the active surface 100A of the semiconductor die 100. The surface 107T is coplanar with the top surface 105T of the conductive bump 105.

In the present disclosure, when semiconductor oxides, for example, silica, serves as the filler material, each of the fillers 107A can be observed to have a filler size in terms of its diameter D. The largest filler size, or diameter D, among the fillers 107A is smaller than the stand-off height H' of the conductive bump 105. In some embodiments, the fillers 107A may possess a size distribution, and the term filler cut refers to the maximum filler size, or diameter D, among the fillers 107A. For example, when the stand-off height H' of the conductive bump 105 is about 25 the filler cut of the fillers 107A is smaller than 25 preferably substantially equal to or smaller than 80% of the stand-off height H', that is, about 20 The volumetric content of the fillers 107A may also affect the delamination between the passivation 109 and the dielectric 107, therefore in some embodiments, the volumetric content of the fillers 107A is less than about 70% in the dielectric 107.

An RDL 110 is positioned over the dielectric 107, forming electrical connection with the top surface 105T of the conductive bump 105. The RDL 110 may include an external circuit 110B and an under bump metallization (UBM) 110A receiving a conductive terminal, for example, a solder bump or a solder ball 120. A dielectric 110C is surrounding the external circuit 110B and the UBM 110A, and interfacing with the dielectric 107.

Referring to FIG. 1B, FIG. 1B illustrates a cross-sectional view of a semiconductor package structure 10B according to some embodiments of the present disclosure. Semiconductor package structure 10B is similar to the semiconductor package structure 10A except for an additional buffer layer 108 positioned over the passivation 109. As shown in FIG. 1B, the buffer layer 108 is disposed between the dielectric 107 and the passivation 109 in order to buffer the direct normal stress impact between the fillers 107A and the passivation 109. In some embodiments, the buffer layer 108 may be composed of polymeric materials such as polyimide (PI) or polybenzoxazole (PBO). Any material having hardness lower than that of the passivation 109 in the semiconductor package structure 10B may be contemplated within the scope of the buffer layer 108 of the present disclosure. In some embodiments, the buffer layer 108 may or may not cover the entire surface of the passivation 109.

A bump height H in semiconductor package structure 10B is measured from the top surface 105T to the bottom surface 105B. As shown in FIG. 1B, a portion of the conductive bump 105 stands off from the passivation 109 and the buffer layer 108 while another portion of which is laterally surrounded by the passivation 109 and the buffer layer 108. A stand-off height H' of the conductive bump 105 is measured from a top surface of the buffer layer 108 to the top surface 105T of the conductive bump 105. In other words, the stand-off height H' of the conductive bump 105 may be the distance between a bottom surface of the RDL 110 and a top surface of the buffer layer 108, regardless the location of the buffer layer 108.

Figure 2:
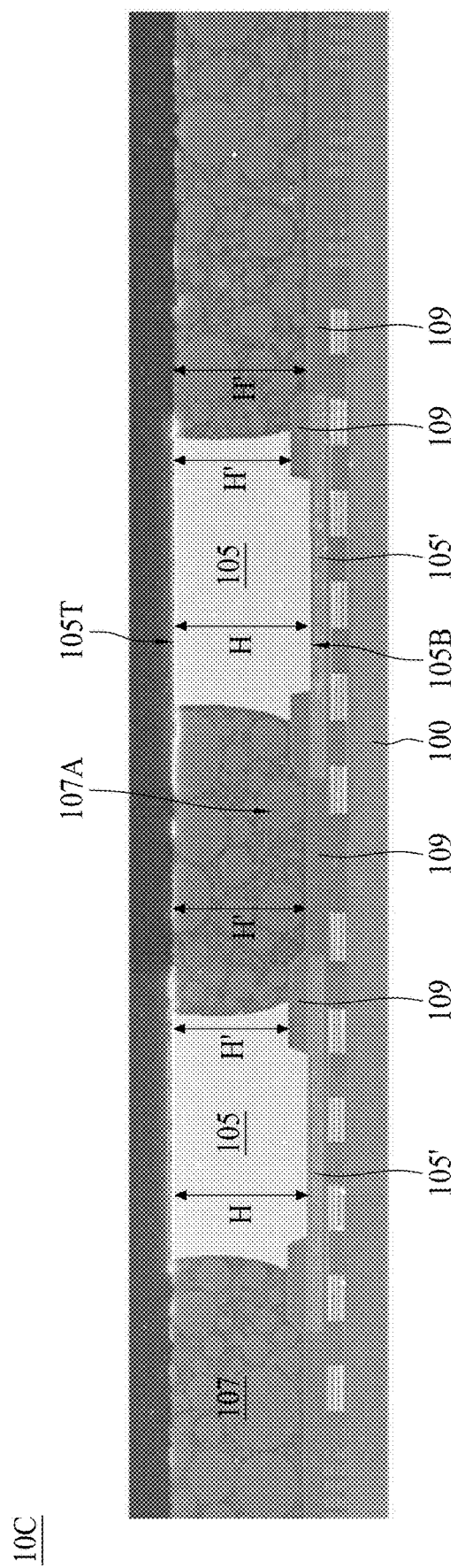
FIG. 2 is a scanning electron microscope (SEM) picture of a semiconductor package structure according to some embodiments of the present disclosure.

FIG. 2 is a scanning electron microscope (SEM) picture of a semiconductor package structure 10C according to some embodiments of the present disclosure. Semiconductor package structure 10C is similar to the semiconductor package structure 10A except that the passivation 109 is having a non-planar top surface. As shown in FIG. 2, the passivation 109 in proximal to a periphery of the conductive pad 105' is elevated by the conductive pad 105' and thus having a top surface elevated from that of the passivation 109 distant to the conductive pad 105'. The fillers 107A in the semiconductor package structure 10C are thus confined in a space with two stand-off heights H'. The first stand-off height H' of the conductive bump 105 is measured from the top of the passivation 109 at the periphery of the conductive pad 105' to the bottom of the external circuit or RDL 110 (reference to FIG. 1A and FIG. 1B). The second stand-off height H' of the conductive bump 105 is measured from the top of the passivation 109 away from the conductive pad 105' to the bottom of the external circuit or RDL 110 (reference to FIG. 1A and FIG. 1B). The stand-off height H' described herein can be referred to both the first stand-off height H' and the second stand-off height H' when the passivation 109 is having a non-planar top surface. The filler cut of the fillers 107A may be smaller than the bump height H. The filler cut of the fillers 107A may be smaller than the second stand-off height H'. The filler cut of the fillers 107A may be smaller than the first stand-off height H'. The filler cut of the fillers 107A may be smaller than 80% of the first and/or the second stand-off height H'. The filler cut of the fillers 107A may be smaller than 60% of the bump height H. The filler cut of the fillers 107A may be smaller than 60% of the first and/or the second stand-off height H'. As shown in FIG. 2, the fillers 107A having a filler cut smaller than the aforesaid dimension, therefore, delamination between the passivation 109 and the dielectric 107 after thermal cycling reliability test may be alleviated. Filler cut that is smaller than a separation between the top surface 107T and the top of the passivation 109 may be contemplated within the scope of the present disclosure.

Figure 3A:
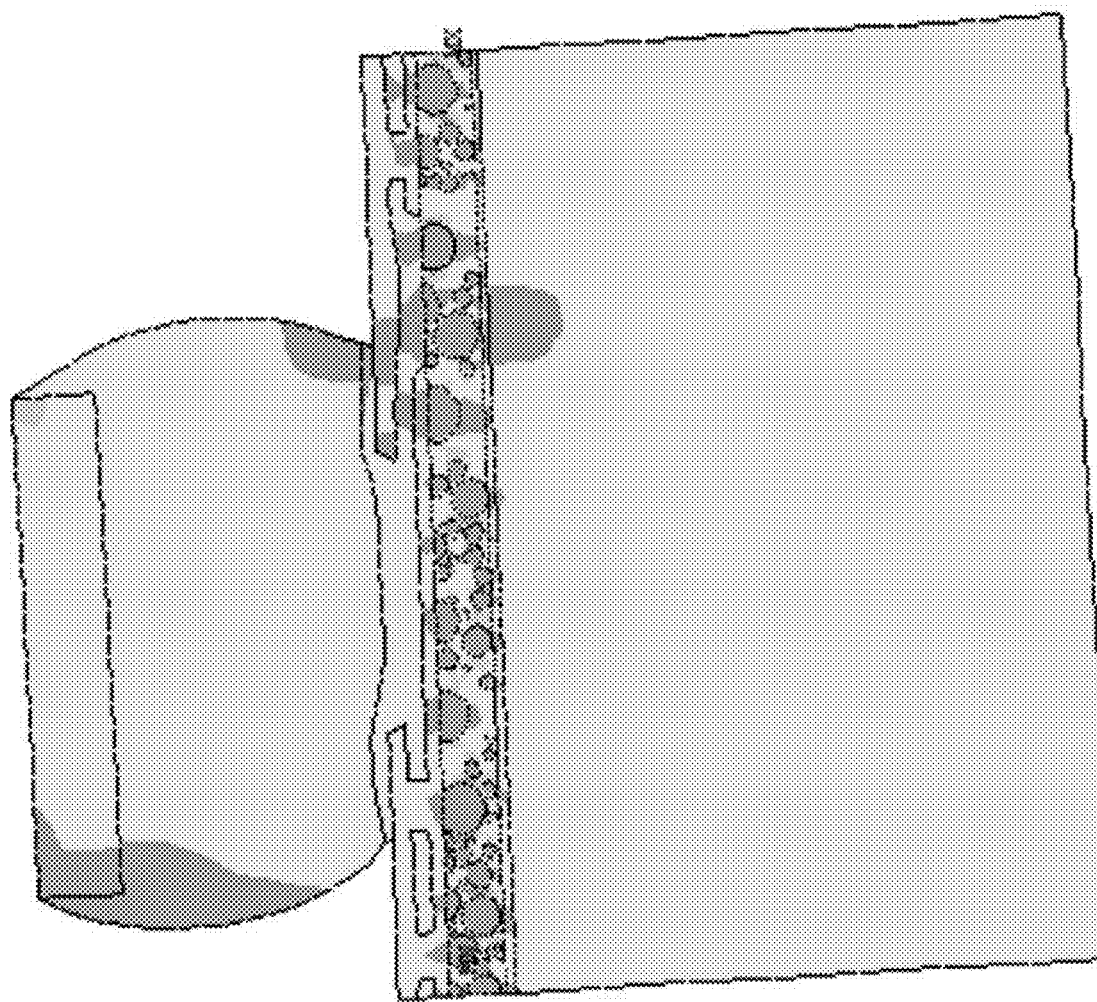
FIG. 3A is a simulation result of normal stress distribution in a semiconductor package structure according to some embodiments of the present disclosure.

FIG. 3A is a simulation result of normal stress distribution in a semiconductor package structure according to some embodiments of the present disclosure. The semiconductor package structure simulated possesses a 20 μm filler cut while a stand-off height of the conductive bump is about 25 μm. Dark shaded areas in the semiconductor package structure represent high normal stress regions. As can be observed, high normal stress regions occur in proximal to the fillers with greater dimensions (e.g., diameters). Compared to a simulation of a comparative embodiment (not shown), where the semiconductor package structure being simulated possesses a 55 μm filler cut while a stand-off height of the conductive bump is about 25 μm, the dark shaded areas in the semiconductor package structure shown in FIG. 3A occupy less area in both the encapsulant body and the associated structures near the encapsulant body.

Figure 3B:
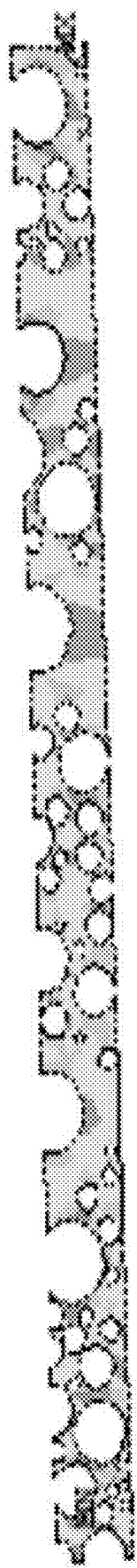
FIG. 3B is a simulation result of normal stress distribution in an encapsulant body of a semiconductor package structure according to some embodiments of the present disclosure.

FIG. 3B is a simulation result of normal stress distribution in an encapsulant body of a semiconductor package structure according to some embodiments of the present disclosure. The semiconductor package structure simulated possesses a 20 μm filler cut while a stand-off height of the conductive bump is about 25 μm. Fillers are removed from the simulation result shown in FIG. 3B. Shaded areas in the encapsulant of the semiconductor package structure represent high normal stress regions. As can be observed, high normal stress regions occur in proximal to the fillers with greater dimensions (e.g., diameters). Compared to a simulation of a comparative embodiment (not shown), where the semiconductor package structure being simulated possesses a 55 μm filler cut while a stand-off height of the conductive bump is about 25 μm, the dark shaded areas in the encapsulant body shown in FIG. 3B occupy less area in the encapsulant body.

Figure 3C:
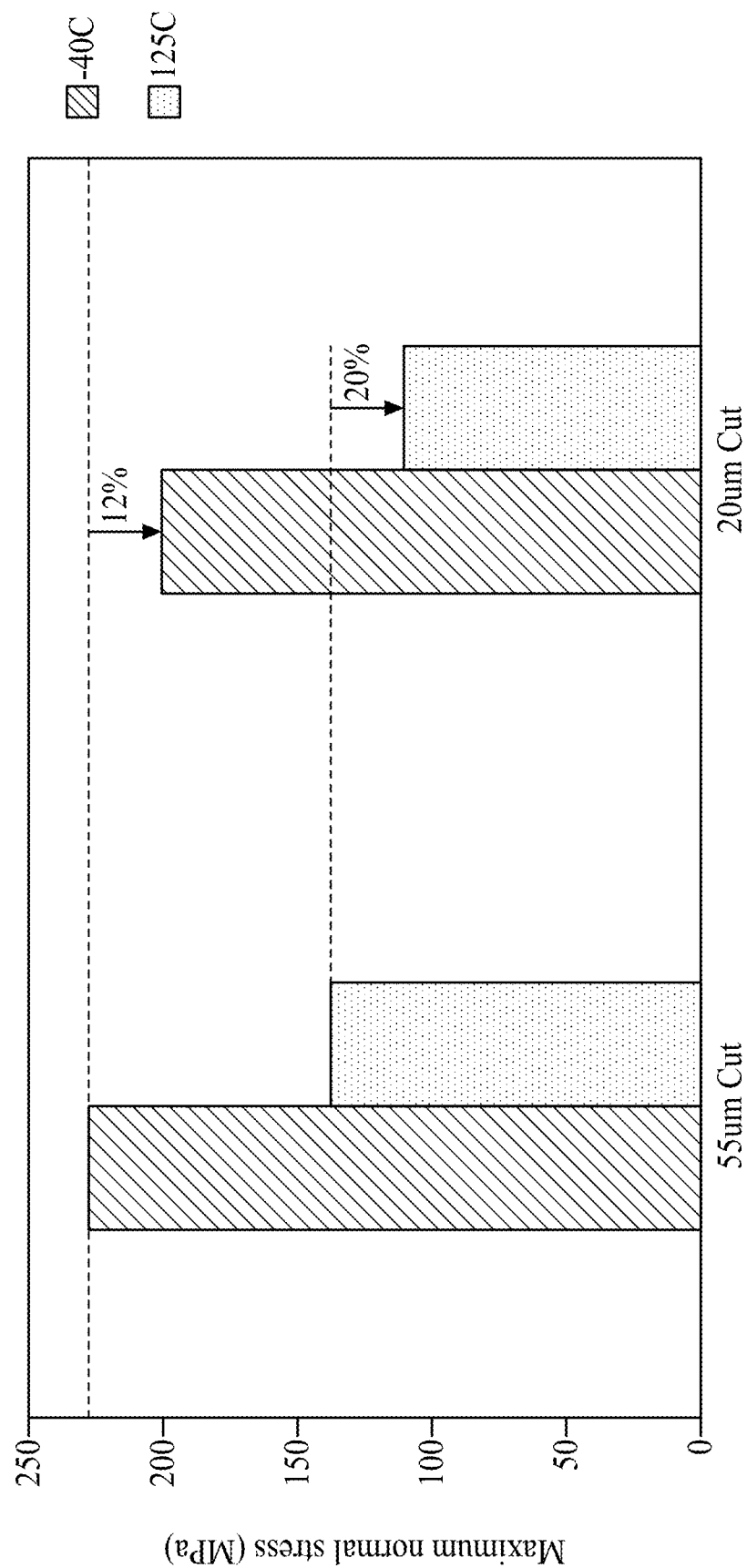
FIG. 3C is a diagram showing maximum normal stress in a comparative semiconductor package structure and a semiconductor package structure according to some embodiments of the present disclosure.

FIG. 3C is a diagram showing maximum normal stress in a comparative semiconductor package structure and a semiconductor package structure according to some embodiments of the present disclosure. The stand-off height in the comparative embodiment and the embodiment of present disclosure is about 25 μm. In the comparative embodiment where the 55 μm filler cut is applied, highest stress 228 MPa is obtained at −40 degrees Celsius and 138 MPa is obtained at 125 degrees Celsius. In the embodiment where the 20 μm filler cut is applied, highest stress 201 MPa is obtained at −40 degrees Celsius and 111 MPa is obtained at 125 degrees Celsius. Alternatively stated, the maximum normal stress is reduced by 12% at −40 degrees Celsius and 20% at 125 degrees Celsius when replacing fillers having a 55 μm filler cut with a 20 μm filler cut.

Figure 4:
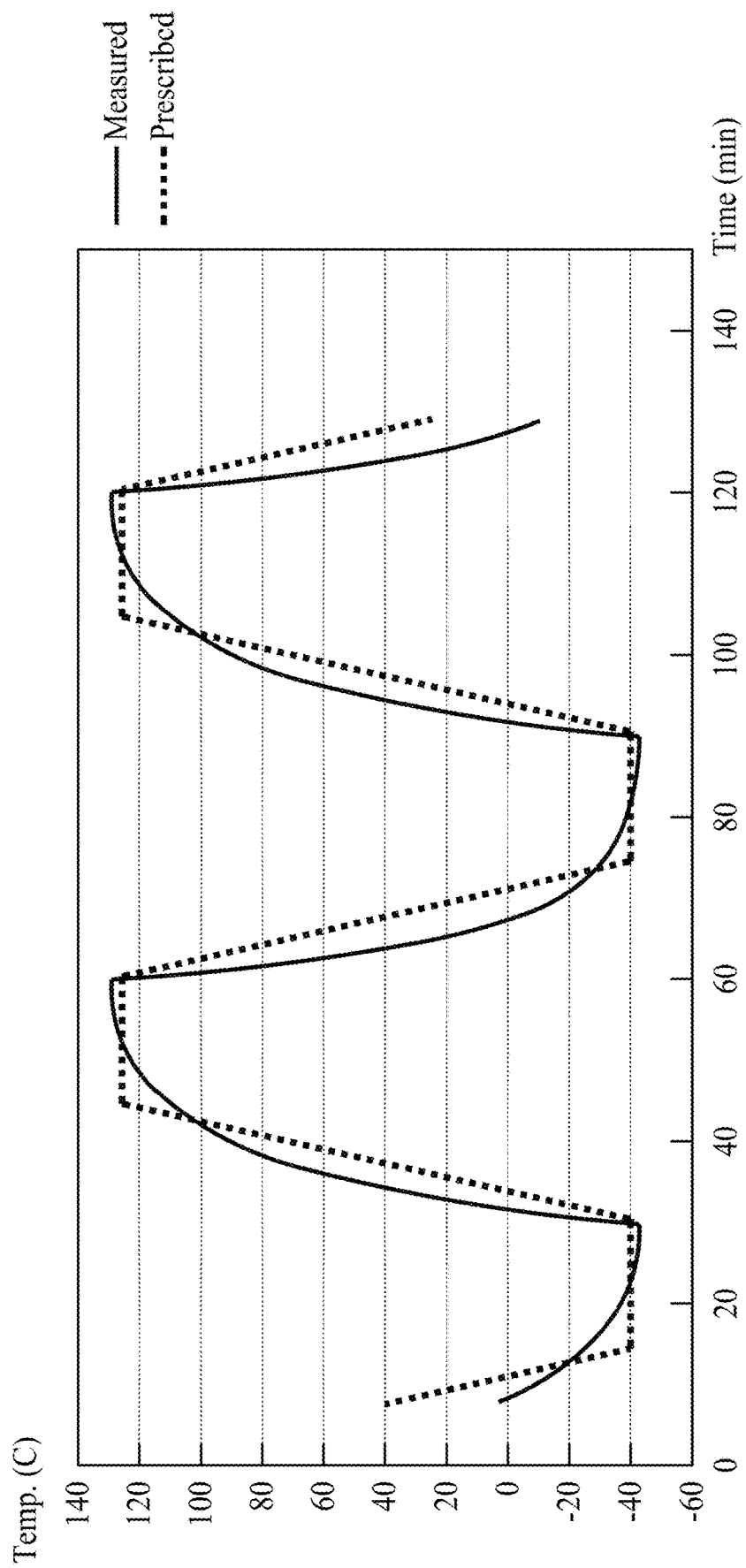
FIG. 4 shows a thermal cycling profile of the thermal cycling reliability test JESD22-A104, according to some embodiments of the present disclosure.

FIG. 4 shows a thermal cycling profile of the thermal cycling reliability test JESD22-A104 under test condition G, according to some embodiments of the present disclosure. FIG. 4 shows the profile of a typical thermal stress cycle produced by thermal stress chamber with a prescribed temperature profile and a corresponding measured temperature profile. Condition G prescribes that the lower temperature to be −40 degrees Celsius, the upper temperature is +125 degrees Celsius, and the cycling rate is typically between 40 to 60 minutes per cycle. The profile of a typical thermal stress cycle, shown in FIG. 4, begins at −40 degrees Celsius, and ramps up to +125 degrees Celsius at a ramp up rate of about 11 degrees Celsius per minute, remains at +125 degrees Celsius for a "dwell time" of approximately 10 to 15 minutes, and then ramps down to −40 degrees Celsius at a ramp down rate of about 11 degrees Celsius per minute, and remains at that temperature for a dwell time of approximately 10 to 15 minutes.

The comparative embodiments of the present disclosure, that is, semiconductor package structure with fillers having a 55 μm filler cut and a stand-off height of about 25 μm, possesses less than 95% passing rate after 1000 cycles of the thermal cycling reliability test of the JESD22-A104, condition G. In some embodiments, in addition to the aforesaid thermal cycling reliability test, the passing rate of the semiconductor package structure of the comparative embodiments is calculated under 192 hours of unbiased Highly Accelerated Temperature and Humidity Stress Test (uHAST) and 75 cycles of liquid to liquid thermal shock (LLTS) testing. However, the embodiments of the present disclosure, that is, semiconductor package structure with fillers having a 20 µm filler cut and a stand-off height of about 25 µm, possesses a passing rate greater than 95%, for example, almost 100%, after the same testing condition.

Figure 5A:
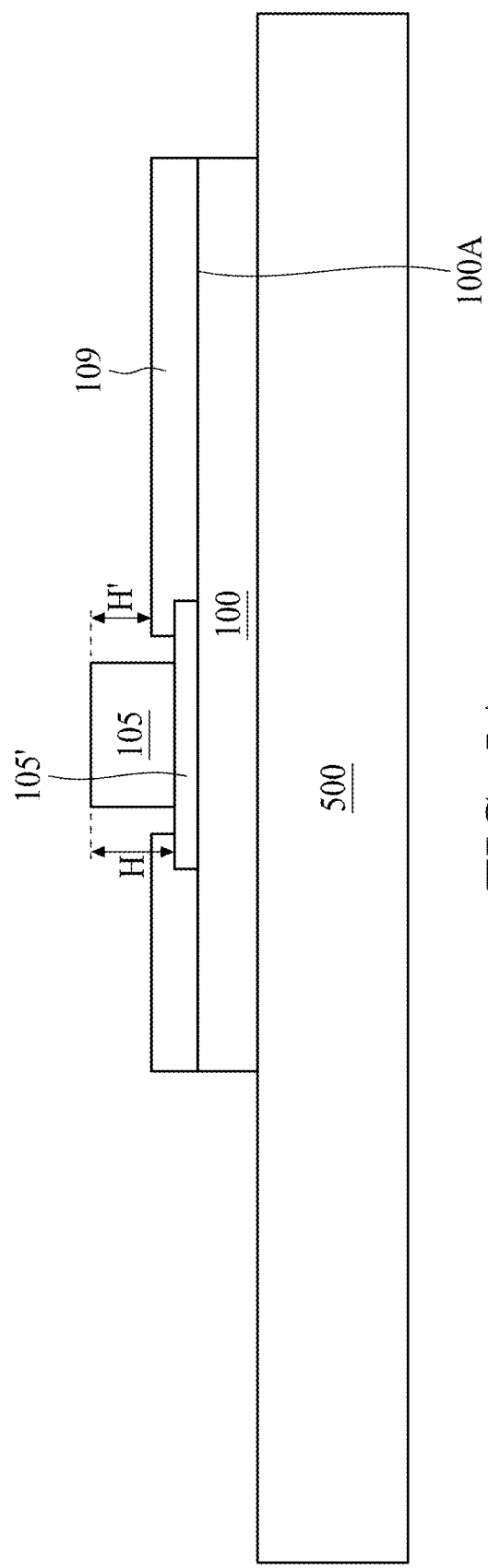
FIG. 5A, FIG. 5B, FIG. 5C, FIG. 5D, and FIG. 5E illustrate cross sectional view of a semiconductor package structure in various operations for manufacturing the semiconductor package structure, according to some embodiments of the present disclosure.

FIG. 5A to FIG. 5E illustrates cross sectional view of a semiconductor package structure in various operations for manufacturing the semiconductor package structure, according to some embodiments of the present disclosure. In FIG. 5A, a semiconductor wafer is sawed into a plurality of individual semiconductor package structures. The plurality of semiconductor package structures are placed on a temporary carrier 500 for inspection and subsequent reconstitution. The package structure includes a semiconductor die 100 having an active surface 100A and a back surface opposite to the active surface 100A. A conductive pad 105' is on the active surface 100A of the semiconductor die 100, and a conductive bump 105 is positioned on the conductive pad 105'. The conductive pad 105' may be partially covered by a passivation 109, which is also disposed on the active surface 100A. In some embodiments, the conductive pad 105' may be adjacent to, under, or exposed from the active surface 100A. As shown in FIG. 5A, a bump height H and a stand-off height H' can be identified.

Figure 5B:
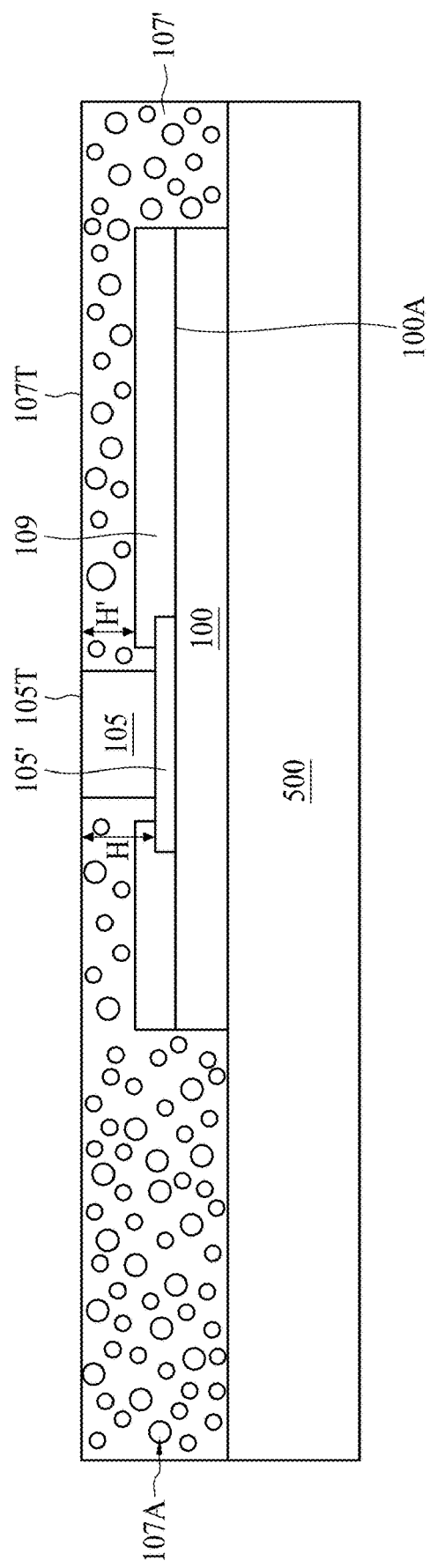

In FIG. 5B, the semiconductor package structure, including the semiconductor die 100, the passivation 109, the conductive pad 105', and the conductive bump 105, are encapsulated by a dielectric 107', or a molding compound referred herein. The dielectric 107' includes a plurality of fillers 107A. As previously described, function of the fillers 107A is to increase mechanical strength of the dielectric 107 and to reduce linear coefficient of thermal expansion of the dielectric 107. The resin is the base material of the dielectric 107. The resin may be either a thermoplastic or thermoset type. Filler material is added to this resin material to enhance structural integrity in IC packaging applications. Fused or crystalline SiO$_2$ (silica) or glass fibers often serve as the filler material. As well as improving the mechanical strength of the molding compound, such filler material also reduces the thermal coefficients of expansion, and, therefore, reduces the dielectric 107 shrinkage after molding. Small amounts of coupling agents, coloring agents, flame retardants, plasticizers, and wax may also be added to optimize the dielectric 107 as specified. Additionally, hardeners and catalysts may be combined with the thermoset resin.

In some embodiments, the encapsulation operation includes an over molding operation where the dielectric 107' covers at least the top of the conductive bump 105, the active surface 100A, and the side surface of the semiconductor die 100, and followed by a grinding operation to expose a top surface 105T of the conductive bump 105. The over molding operation and the grinding operation may be conducted with the temporary carrier 500 attached to the back surface of the semiconductor die 100. Subsequently, the temporary carrier 500 can be removed. Note the dielectric 107' possesses a surface 107T parallel and proximal to the active surface 100A of the semiconductor die 100. The surface 107T is coplanar with the exposed top surface 105T of the conductive bump 105 after the grinding operation.

Optionally, a buffer layer (not shown in FIG. 5B) may be layered over the passivation 109 prior to the encapsulation operation. The buffer layer may be composed of polymeric materials such as polyimide (PI) or polybenzoxazole (PBO). Any material having a hardness lower than that of the passivation 109 may be contemplated within the scope of the buffer layer of the present disclosure. In some embodiments, the buffer layer may cover an entire surface of the passivation 109. In some embodiments, where the passivation 109 has a discrete pattern over the active surface 100A of the semiconductor die 100, the buffer layer may cover a portion of the active surface 100A.

During grinding operation, the grinding head may be in contact with the fillers 107A of the dielectric 107', and further affect the underlying passivation 109 from a normal stress point of view. If the filler cut of the fillers 107A is about the stand-off height H', it is highly possible that the grinding head could directly transfer the normal stress to the underlying passivation 109 through the fillers 107A, fostering the delamination of the passivation layer during the subsequent thermal cycling reliability test. If, however, the filler cut of the fillers 107A is smaller the stand-off height H', it is highly possible that the grinding head could not directly transfer the normal stress to the underlying passivation 109 through the fillers 107A, and the delamination of the passivation layer during the subsequent thermal cycling reliability test can be alleviated. Preferably, the filler cut may be smaller than 80% of the stand-off height H'. Preferably, the filler cut may be smaller than 60% of the bump height H.

Depending on the configuration of the semiconductor package structure, as previously discussed in FIG. 1A and FIG. 2, the filler cut may be smaller than the stand-off height H' in FIG. 1A or smaller than the bump height H in FIG. 2. A filler cut that is smaller than a separation between the top surface 107T and the top of the passivation 109 may be contemplated within the scope of the present disclosure.

Figure 5C:
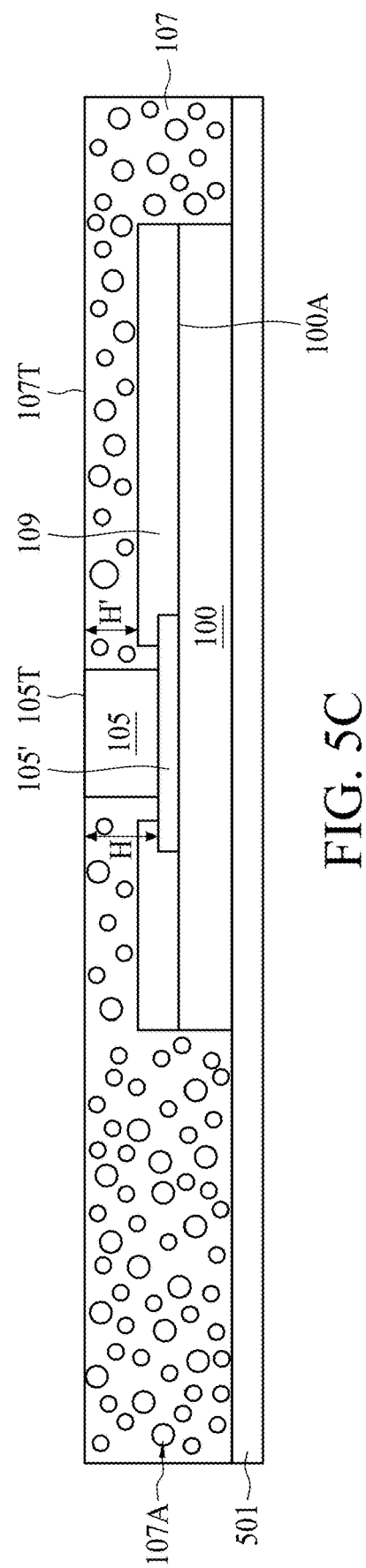

In FIG. 5C, the temporary carrier 50 is removed and a backside lamination 501 is applied to a back surface of the semiconductor die 100, as well as a bottom surface of the dielectric 107. The dielectric 107 of FIG. 5C is thinner than the dielectric 107' of FIG. 5B due to the grinding operation being performed to obtain a predetermined bump height H or a predetermined stand-off height H'.

Figure 5D:
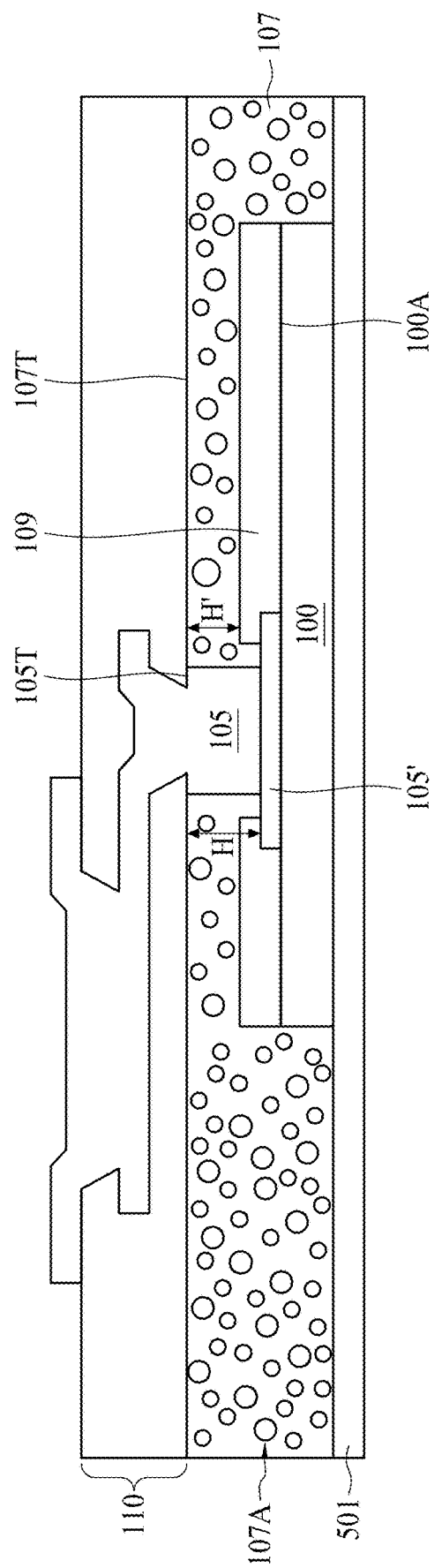
Figure 5E:
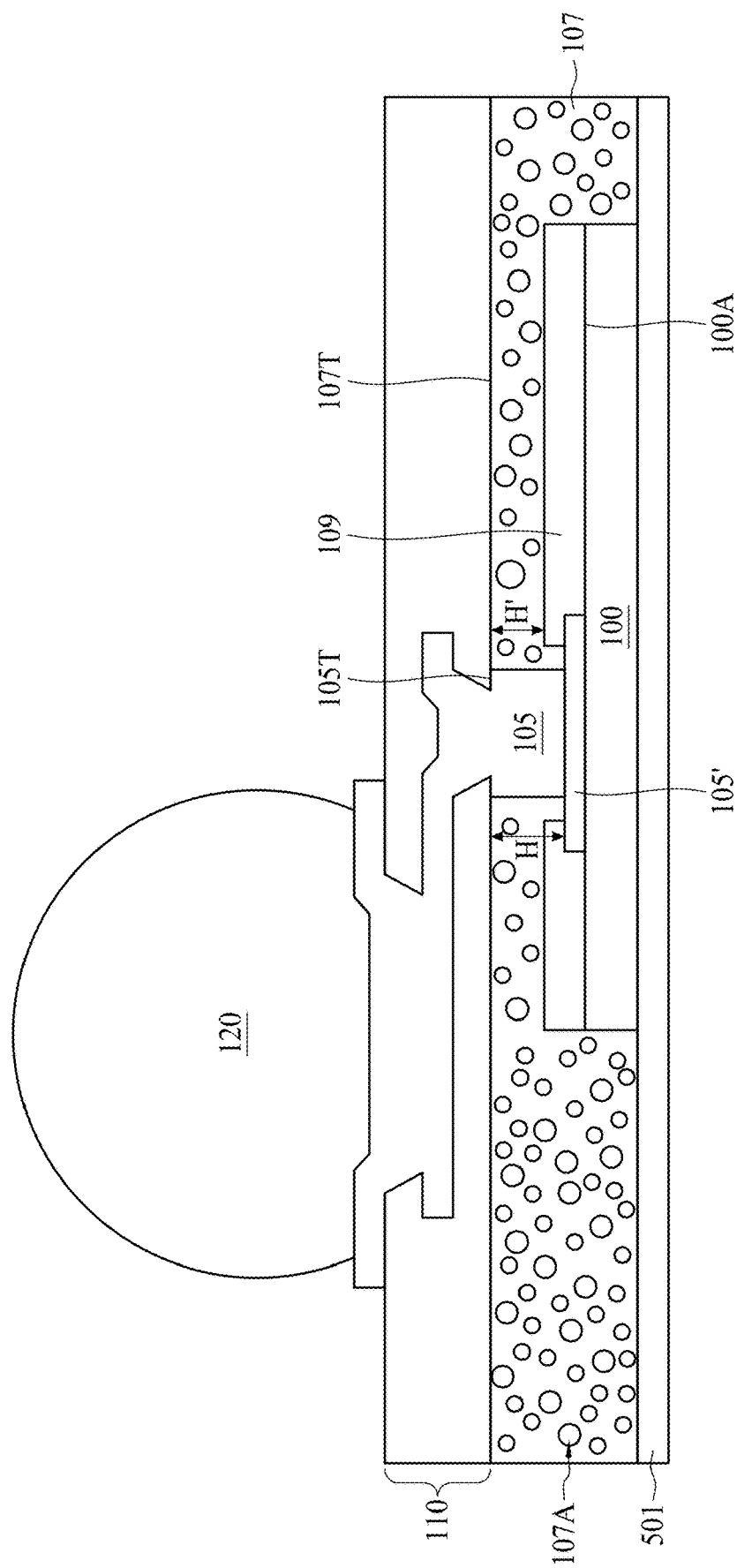

In FIG. 5D, a redistribution layer (RDL) 110 is formed over the coplanar surface composed of the top surface 105T of the conductive bump 105 and the top surface 107T of the dielectric 107. In FIG. 5E, a conductive terminal, for example, a solder bump or a solder ball 120, is formed over the RDL 110.

Figure 6B:
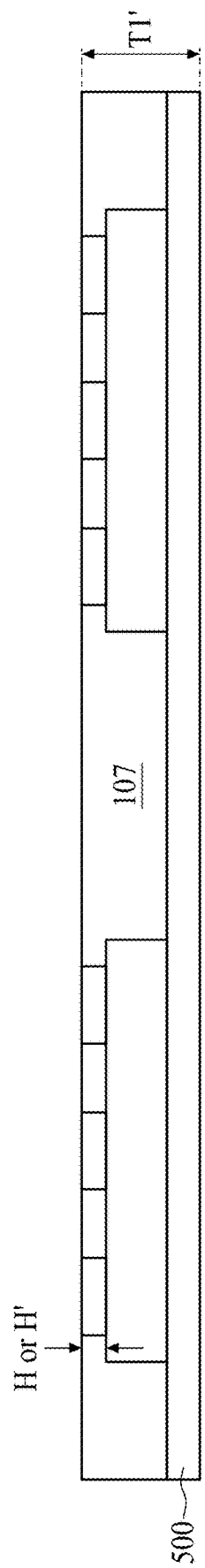

Referring to FIG. 6A and FIG. 6B, FIG. 6A to FIG. 6B illustrate cross sectional view of a semiconductor package structure in the previously addressed grinding operation for manufacturing the semiconductor package structure, according to some embodiments of the present disclosure. For the sake of clarity, the fillers in the dielectric 107, the passivation, and the conductive pad are omitted in FIG. 6A and FIG. 6B. As previously described, after the over molding operation, the dielectric 107', or the molding compound referred herein, is thinned down by a grinding operation. The grinding operation not only thins down the dielectric 107' to expose the conductive bump 105 but also removes a portion of the conductive bump 105 to obtain a predetermined bump height H or stand-off height H'. For example, a thickness T1 of the dielectric 107' and the temporary carrier 500 may be of about 615 µm prior to the grinding operation. A thickness T1' of the dielectric 107 and the temporary carrier 500 may be of about 565 µm after the grinding operation. When the grinding operation is completed, the predetermined bump height H and the stand-off height H' are obtained. Since the bump height H and the stand-off height H' are predetermined, one is able to decide the filler cut to be used prior to applying the dielectric 107', or the molding compound referred herein.

Figure 7A:
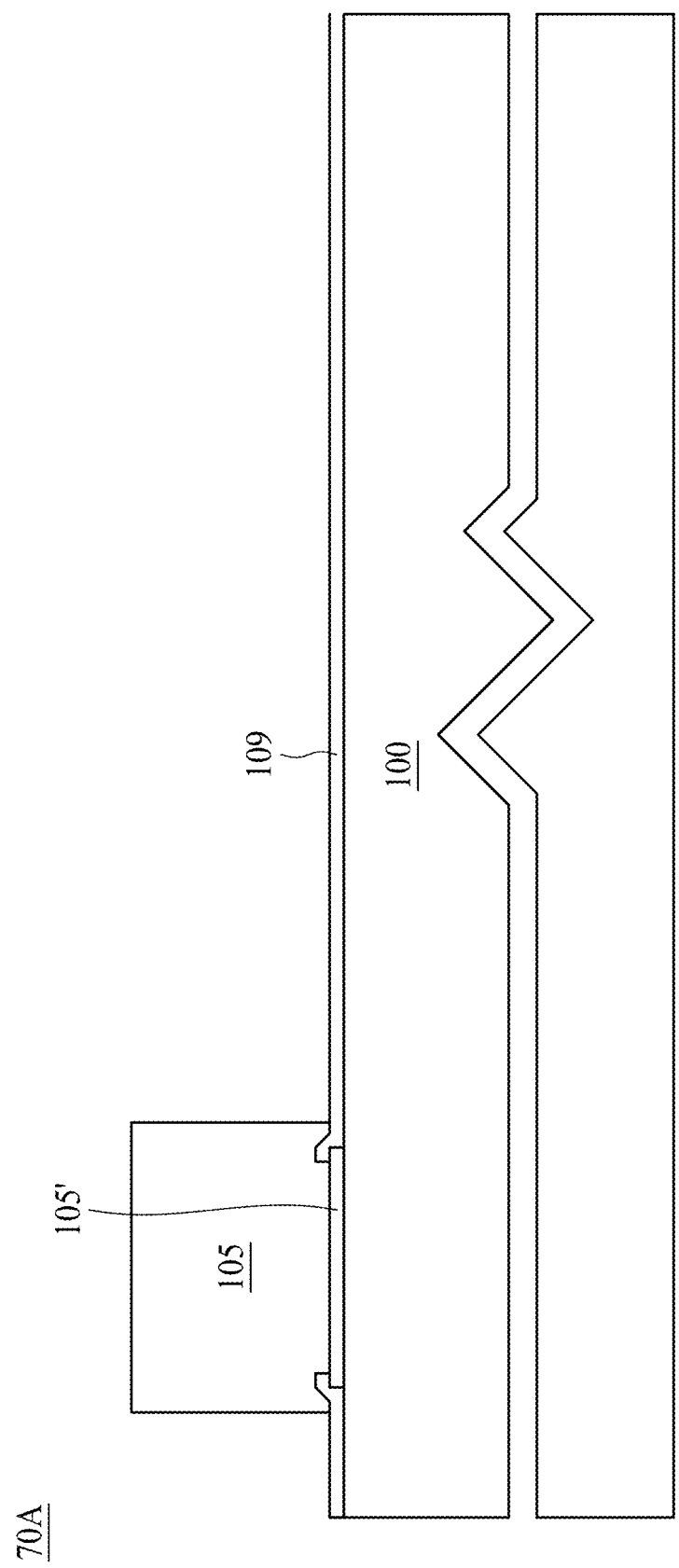
FIG. 7A, FIG. 7B, and FIG. 7C illustrate a cross-sectional view of a semiconductor package structure according to some embodiments of the present disclosure.
Figure 7B:
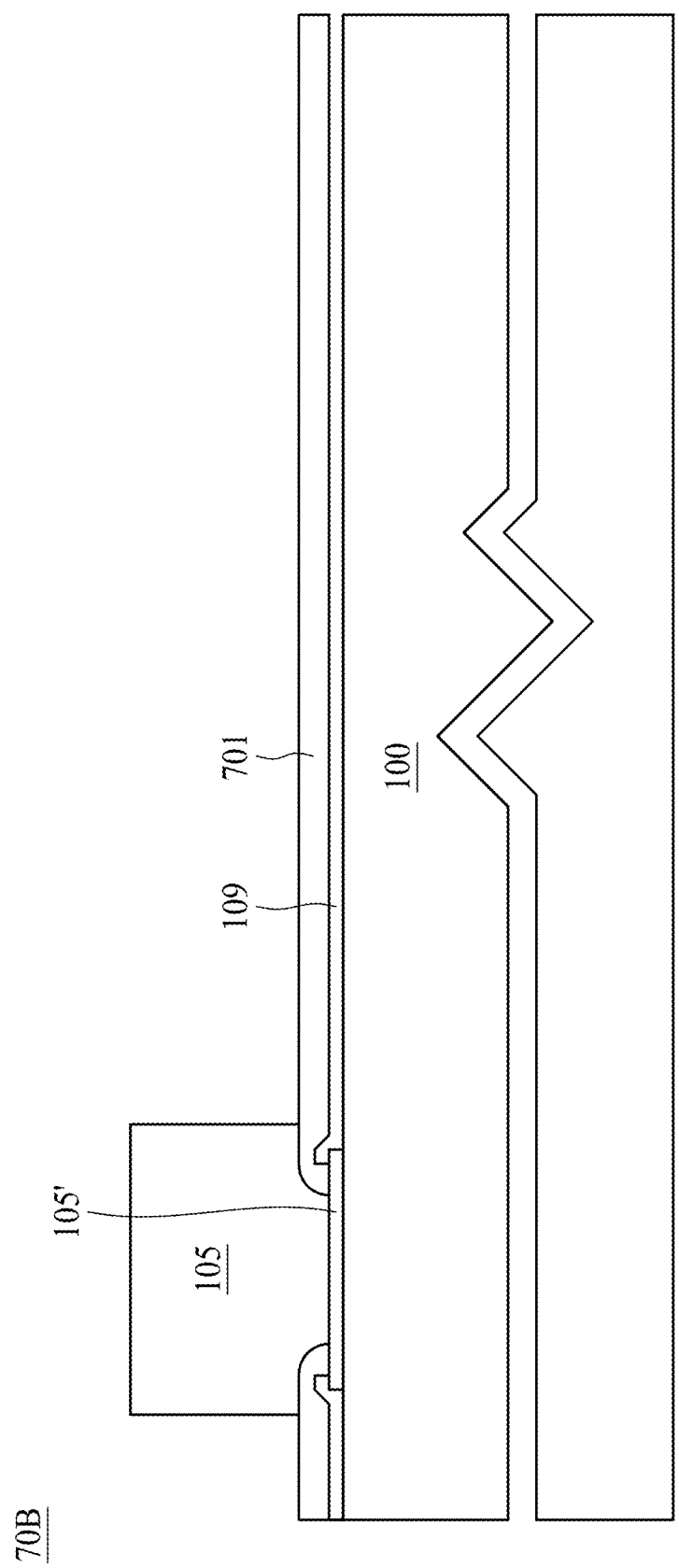
Figure 7C:
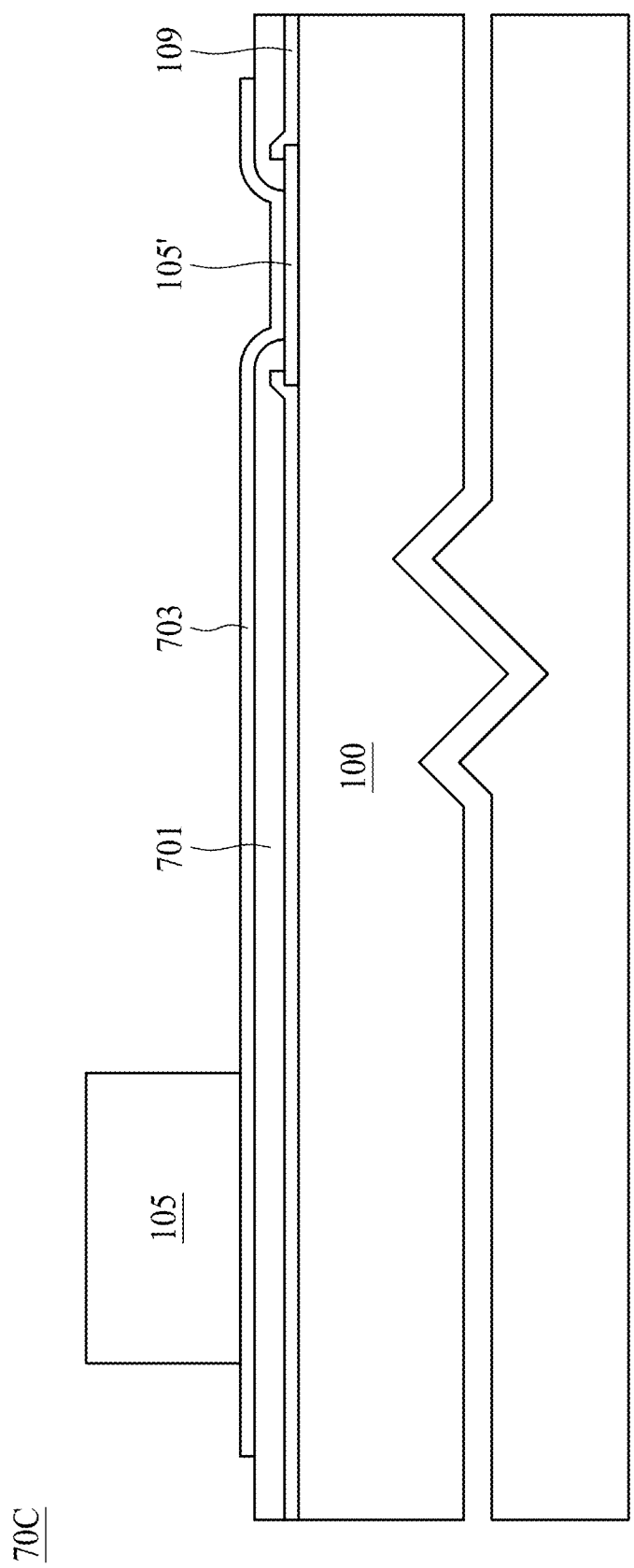

FIG. 7A, FIG. 7B, and FIG. 7C illustrate a cross-sectional view of a semiconductor package structure according to some embodiments of the present disclosure. FIG. 7A, FIG.

7B, and FIG. 7C show the conductive bump 105 stack up options in the M-series package structure. For the sake of clarity, the dielectric 107 of the semiconductor package is omitted. For example, the semiconductor package structure 70A includes a conductive pad 105', a passivation 109 partially covering the conductive pad 105', and a conductive bump 105 overlying the conductive pad 105', and a portion of the passivation 109. The semiconductor package structure 70B includes conductive pad 105', a first passivation 109 partially covering the conductive pad 105', a second passivation 701 partially covering the conductive pad 105', and a conductive bump 105 overlying the conductive pad 105'. The semiconductor package structure 70C includes conductive pad 105', a first passivation 109 partially covering the conductive pad 105', a second passivation 701 partially covering the conductive pad 105', a conductive trace 703 electrically connecting the conductive pad 105' and the conductive bump 105. The conductive pad 105' is free from the projection coverage of the conductive bump 105.

Figure 8A:
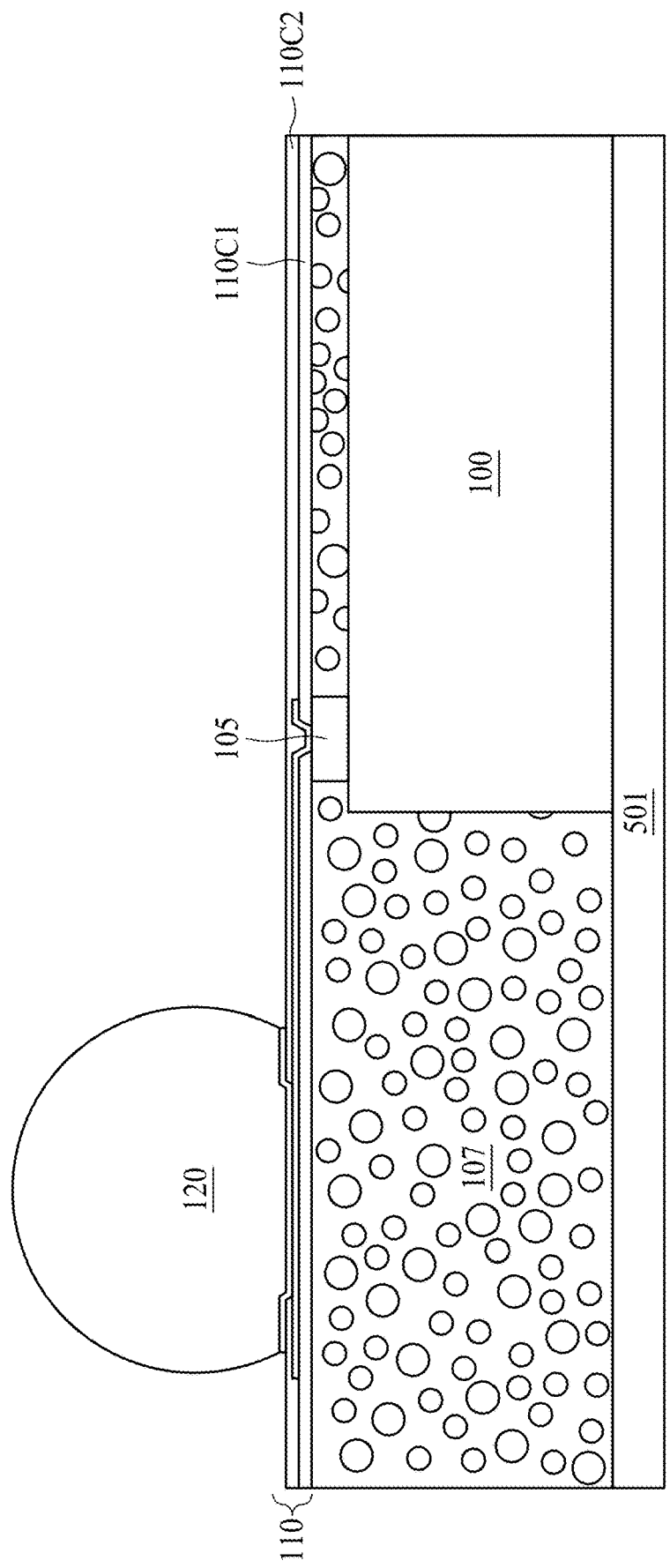
FIG. 8A and FIG. 8B illustrate a cross-sectional view of a semiconductor package structure according to some embodiments of the present disclosure.
Figure 8B:
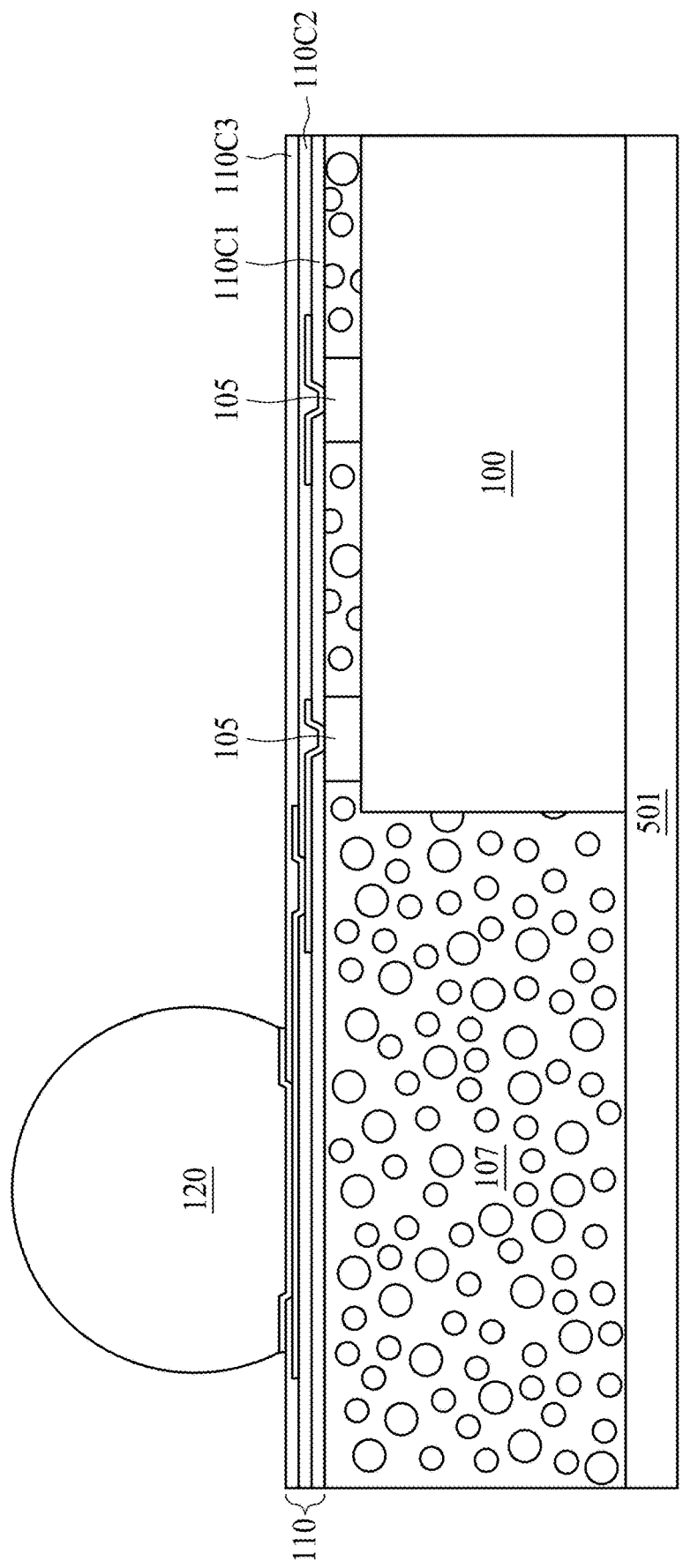

FIG. 8A and FIG. 8B illustrate a cross-sectional view of a semiconductor package structure according to some embodiments of the present disclosure. FIG. 8A and FIG. 8B show panelization stack up options in the M-series package structure, including at least a semiconductor die 100, a dielectric 107, a backside laminate 501, conductive bump 105, RDL 110, and conductive terminal, for example, solder ball 120. In FIG. 8A, the RDL 110 structure over the coplanar surface of the dielectric 107 and the conductive bump 105 includes two polymer layers 110C1, 110C2. In FIG. 8B, the RDLs 110 structure over the coplanar surface of the dielectric 107 and the conductive bump 105 includes two RDLs and three polymer layers 110C1, 110C2, and 110C3. One RDL is associated with the left conductive bump 105 and the other RDL is associated with the right conductive bump 105.

Figure 9:
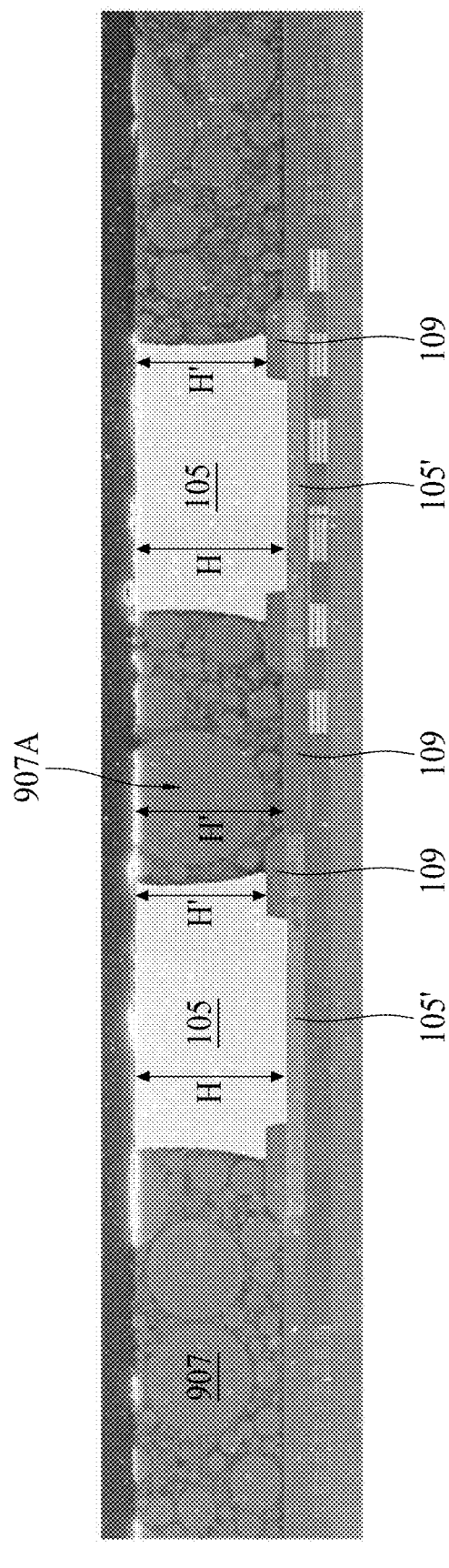
FIG. 9 is a scanning electron microscope (SEM) picture of a semiconductor package structure according to some comparative embodiments of the present disclosure.

FIG. 9 is a scanning electron microscope (SEM) picture of a semiconductor package structure 90 according to some comparative embodiments of the present disclosure. As shown in FIG. 9, the passivation 109 in proximal to a periphery of the conductive pad 105' is elevated by the conductive pad 105' and thus having a top surface elevated from that of the passivation 109 distant to the conductive pad 105'. The fillers 907A in the semiconductor package structure 90 are thus confined in a space with two stand-off heights H'. The first stand-off height H' of the conductive bump 105 is measured from the top of the passivation 109 at the periphery of the conductive pad 105' to the bottom of the external circuit or RDL 110 (reference to FIG. 1A and FIG. 1B). The second stand-off height H' of the conductive bump 105 is measured from the top of the passivation 109 away from the conductive pad 105' to the bottom of the external circuit or RDL 110 (reference to FIG. 1A and FIG. 1B). The stand-off height H' described herein can be referred to both the first stand-off height H' and the second stand-off height H' when the passivation 109 is having a non-planar top surface. As shown in FIG. 9, the fillers 907A having a filler cut greater than the first stand-off height H', therefore, delamination between the passivation 109 and the dielectric 907 after thermal cycling reliability test may readily occur.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
    a semiconductor substrate having an active surface and a sidewall;
    a conductive bump on the active surface, the conductive bump having a stand-off height extending along a first direction;
    a passivation on the active surface;
    an encapsulant encapsulating the semiconductor substrate and encapsulating the conductive bump, wherein the encapsulant contacting the sidewall of the semiconductor substrate; and
    a plurality of fillers in the encapsulant, wherein a diameter of the fillers along the first direction is smaller than the stand-off height.

2. The semiconductor package structure of claim 1, further comprising:
    a conductive pad on the active surface, wherein the conductive pad is covered by the passivation.

3. The semiconductor package structure of claim 1, wherein the encapsulant comprises a surface parallel and proximal to the active surface of the semiconductor substrate, the surface of the encapsulant being substantially coplanar with a top surface of the conductive bump.

4. A semiconductor package structure, comprising:
   a semiconductor substrate having an active surface and a sidewall;
   a conductive pad on the active surface;
   a passivation covering the pad and over the active surface;
   a conductive bump on the conductive pad; and
   an encapsulant encapsulating the semiconductor substrate and encapsulating the conductive bump, wherein the encapsulant contacting the sidewall of the semiconductor substrate;
   wherein the semiconductor package structure having a passing rate greater than 95% to JESD22-A104G test; and
   wherein the encapsulant has a plurality of silica spheres, wherein a diameter of the silica spheres is smaller than a stand-off height.

5. The semiconductor package structure of claim 4, wherein the encapsulant is a stress releasing layer.

6. The semiconductor package structure of claim 4, wherein the stand-off height is measured from a top surface of the passivation to a top surface of the conductive bump.

7. The semiconductor package structure of claim 6, wherein the top surface of the conductive bump is substantially coplanar with a top of the encapsulant.

8. The semiconductor package structure of claim 1, wherein the dimension of the fillers along the first direction is smaller than 80% of the stand-off height.

9. The semiconductor package structure of claim 1, wherein the passivation has a recessed portion.

10. The semiconductor package structure of claim 9, wherein at least one of the plurality of fillers is disposed in the recessed portion of the passivation.

11. The semiconductor package structure of claim 9, wherein at least one of the plurality of fillers contacts the recessed portion of the passivation.

12. The semiconductor package structure of claim 1, wherein the conductive bump has a curved sidewall.

13. The semiconductor package structure of claim 1, wherein the conductive bump is tapered along the first direction.

14. The semiconductor package structure of claim 1, wherein the passivation includes a first passivation and a second passivation spaced apart from the first passivation, wherein an overlapping width between the conductive bump and the first passivation is different from an overlapping width between the conductive bump and the second passivation.

15. The semiconductor package structure of claim 1, wherein at least one of the plurality of fillers has a truncated surface.

16. The semiconductor package structure of claim 15, wherein the truncated surface of at least one of the fillers is substantially coplanar with a top surface of the conductive bump.

17. The semiconductor package structure of claim 3, wherein the conductive bump is positioned on the conductive pad.

* * * * *